United States Patent
Huffman et al.

(10) Patent No.: US 7,919,775 B2
(45) Date of Patent: Apr. 5, 2011

(54) SEMICONDUCTOR DEVICE AND METHOD COMPRISING A HIGH VOLTAGE RESET DRIVER AND AN ISOLATED MEMORY ARRAY

(75) Inventors: James D. Huffman, Pittsford, NY (US); James N. Hall, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 12/472,913

(22) Filed: May 27, 2009

(65) Prior Publication Data
US 2009/0231932 A1   Sep. 17, 2009

Related U.S. Application Data

(62) Division of application No. 11/759,160, filed on Jun. 6, 2007, now Pat. No. 7,548,365.

(51) Int. Cl.
*H01L 23/58* (2006.01)

(52) U.S. Cl. ..... 257/48; 257/50; 257/781; 257/E23.169; 257/E21.143; 257/E21.524; 345/84; 345/85; 345/100; 345/204; 327/142; 327/333

(58) Field of Classification Search ............ 257/48, 257/50, 781, 786, E23.169, E21.143, E21.524; 359/291, 295, 212, 248, 249; 345/84, 85, 345/100, 204; 327/142, 333
See application file for complete search history.

(56) References Cited

U.S. PATENT DOCUMENTS

| | | | |
|---|---|---|---|
| 5,222,041 A | 6/1993 | Nishimori et al. | |
| 5,426,616 A | 6/1995 | Kajigaya et al. | |
| 5,498,554 A | 3/1996 | Mei | |
| 5,581,272 A | 12/1996 | Conner et al. | |
| 5,610,624 A | 3/1997 | Bhuva | |
| 5,614,921 A | 3/1997 | Conner et al. | |
| 5,706,123 A | 1/1998 | Miller et al. | |
| 5,973,963 A | 10/1999 | Sugawara | |
| 6,191,883 B1 | 2/2001 | Huffman et al. | |
| 6,266,178 B1 | 7/2001 | Huffman | |
| 6,344,672 B2 | 2/2002 | Huffman | |
| 6,492,850 B2 | 12/2002 | Kato et al. | |
| 6,529,407 B2 | 3/2003 | Shukuri | |
| 6,636,441 B2 | 10/2003 | Taura | |
| 6,724,657 B2 | 4/2004 | Shukuri | |
| 6,731,273 B2 | 5/2004 | Koyama et al. | |
| 6,819,470 B2 | 11/2004 | Meier et al. | |
| 6,831,294 B1 * | 12/2004 | Nishimura et al. | 257/48 |

(Continued)

FOREIGN PATENT DOCUMENTS

KR   10-2000-0041596 A   7/2000

*Primary Examiner* — Zandra Smith
*Assistant Examiner* — Telly D Green
(74) *Attorney, Agent, or Firm* — Charles A. Brill; Wade James Brady, III; Frederick J. Telecky, Jr.

(57) ABSTRACT

A method of operating a semiconductor device, a semiconductor device and a digital micromirror system are presented. In an embodiment, the semiconductor device comprises a grounded substrate, a memory array, and a reset driver. The memory array may be isolated from the grounded substrate with a buried layer. The set of voltages of the memory array may be shifted with respect to a reset voltage. The reset driver may drive the reset voltage and the reset driver may have at least one extended drain transistor in the grounded substrate.

8 Claims, 5 Drawing Sheets

U.S. PATENT DOCUMENTS

| | | |
|---|---|---|
| 7,011,415 B2 | 3/2006 | DiCarlo et al. |
| 7,061,463 B2 | 6/2006 | Crossland et al. |
| 7,187,218 B2 | 3/2007 | Gossmann |
| 7,247,879 B2 * | 7/2007 | Nishimura et al. ............ 257/50 |
| 7,251,148 B2 | 7/2007 | Ma et al. |
| 7,324,097 B2 | 1/2008 | Koyama et al. |
| 7,550,763 B2 * | 6/2009 | Nishimura et al. ............ 257/48 |
| 2009/0230448 A1 * | 9/2009 | Nishimura et al. ........... 257/296 |

* cited by examiner

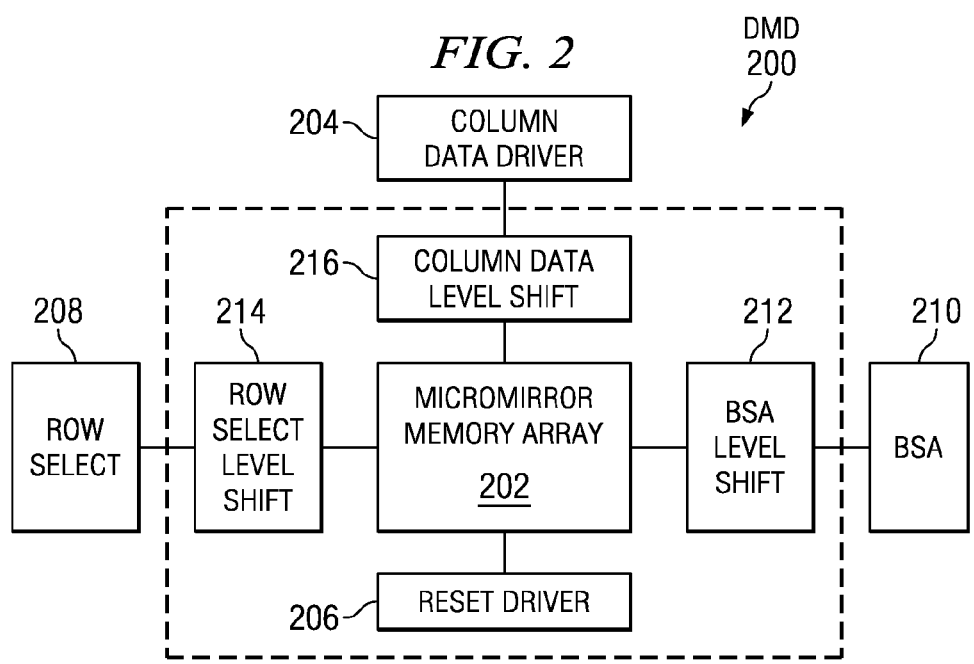
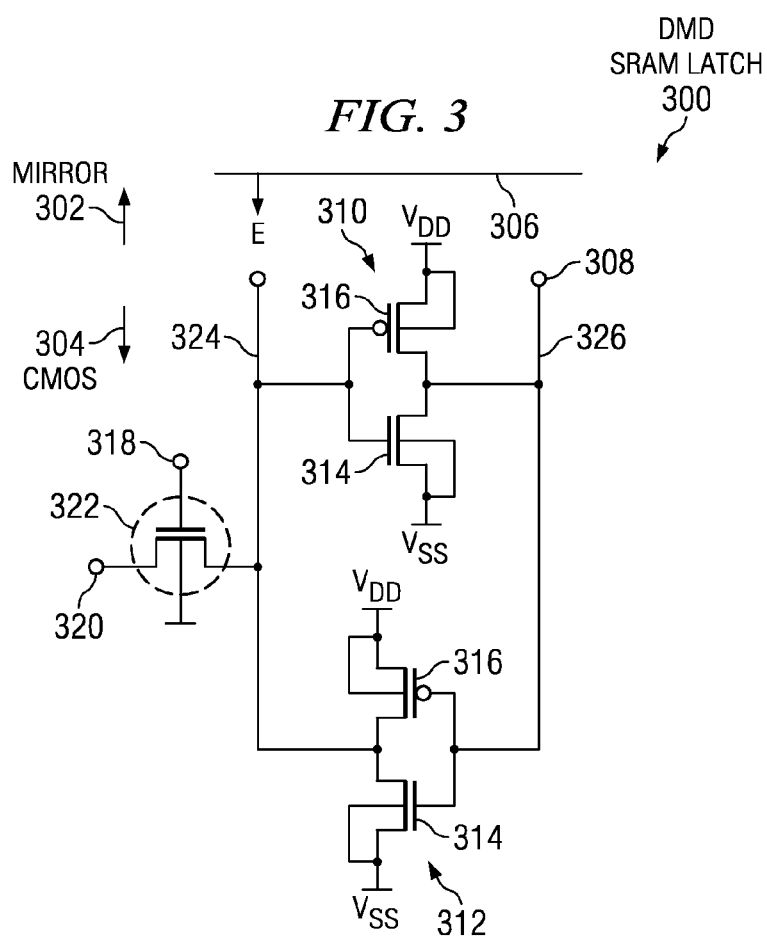

SEMICONDUCTOR DEVICE AND METHOD COMPRISING A HIGH VOLTAGE RESET DRIVER AND AN ISOLATED MEMORY ARRAY

This application is a divisional of application Ser. No. 11/759,160, filed Jun. 6, 2007.

TECHNICAL FIELD

The illustrative embodiments relate to a semiconductor device and method, and more particularly to a semiconductor device and method comprising a high voltage reset driver and an isolated memory array.

BACKGROUND

A digital micromirror device (DMD) is a type of microelectromechanical system (MEMS) device. More specifically, the DMD is a fast response, reflective digital spatial light modulator. It can be combined with image processing, memory, a light source, and optics to form a digital light processing system capable of projecting large, bright, high-contrast, color images.

A DMD may be fabricated using complementary metal-oxide semiconductor (CMOS)-like processes over a CMOS memory. A typical DMD comprises an array of individually addressable mirror elements, each having an aluminum mirror that can reflect light in one of two directions, depending on the state of an underlying memory cell. These mirrors may be fabricated over address circuitry that has static random access memory (SRAM) cells and address electrodes. Each mirror forms one pixel and is bistable, such that light directed upon the mirror will be reflected in one of two directions. In an "on" mirror position, light is reflected to a projector lens and focused on a display plane. In the "off" position, light is deflected to a light absorber. The array of "on" and "off" pixels produces an image. Color is achieved by using color light sources or filters, either stationary or rotating, in combination with one or a plurality of DMD chips.

Generally, with the SRAM cell in a first state, "on," the mirror rotates to +12 degrees, and with the memory cell in a second state, "off," the mirror rotates to −12 degrees. Reset drivers are used to transition the mirror to the appropriate state of the memory cell.

Generally, a bipolar reset waveform is generated by the reset drivers. Integration of the reset drivers generally requires active devices in order to switch the higher voltage levels in the bipolar reset waveform. One disadvantage of the prior art is that the integration of the bipolar reset drivers and associated circuitry onto the DMD CMOS substrate may not be accomplished in a normal CMOS process due to the large magnitude of a negative reset voltage in the bipolar waveform. In particular, the reset voltage, which is negative with respect to the substrate, generally will forward bias PN junctions with respect to the substrate. Another disadvantage is the cost of processing that is involved in integrating the bipolar structures on the CMOS substrate.

SUMMARY OF THE INVENTION

These and other problems are generally solved or circumvented, and technical advantages are generally achieved, by preferred embodiments in which a high voltage reset driver and an isolated memory array are integrated on a semiconductor substrate.

In a first embodiment, a semiconductor device comprises a grounded substrate, a memory array, and a reset driver. The memory array is isolated from the grounded substrate with a buried layer. The set of voltages of the memory array are shifted with respect to a reset voltage. The reset driver drives the reset voltage and the reset driver has at least one extended drain transistor in the grounded substrate.

Another embodiment provides for a digital micromirror device (DMD) system comprising a memory array disposed on a substrate, level shift circuitry configured to shift a set of voltages of the memory array with respect to a reset voltage, a reset driver configured to drive the reset voltage, an array of address electrodes electrically coupled to the memory array, an array of micromirrors disposed over the array of address electrodes; and a reset driver configured to drive the reset voltage to reset at least one micromirror in the array of micromirrors.

In another embodiment, a method of operating a DMD comprises forming a set of shifted voltages of the SRAM memory array, including a row select voltage, a column data voltage and BSA voltages with respect to a reset voltage, grounding a substrate, which is electrically coupled to a reset driver, and producing, using the set of shifted voltages, an electrostatic field between at least one micromirror and at least one address electrode.

An advantage of an illustrative embodiment is a low cost integration of the high voltage reset with a CMOS process. A further advantage of an illustrative embodiment is a more robust structure with higher breakdown voltages.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a block diagram depicting some of the main components of a DMD device;

FIG. 3 is a schematic of a portion of a DMD showing an SRAM latch, mirror layers, row select and column data circuitry in accordance with the illustrative embodiments;

DETAILED DESCRIPTION OF ILLUSTRATIVE EMBODIMENTS

The making and using of the presently preferred embodiments are discussed in detail below. It should be appreciated, however, that the illustrative embodiments provide many applicable inventive concepts that can be embodied in a wide variety of specific contexts. The specific embodiments discussed are merely illustrative of specific ways to make and use the invention, and do not limit the scope of the invention.

The illustrative embodiments will be described in a specific context, namely a digital micromirror device (DMD). The embodiments may also be applied, however, to other devices having CMOS circuitry requiring a high voltage signal. In an illustrative embodiment, a DMD device is implemented with a reset driver in a grounded substrate, by isolating the substrate from the DMD memory array well regions, and by shifting the operating voltages of the DMD memory array.

Figure 1:
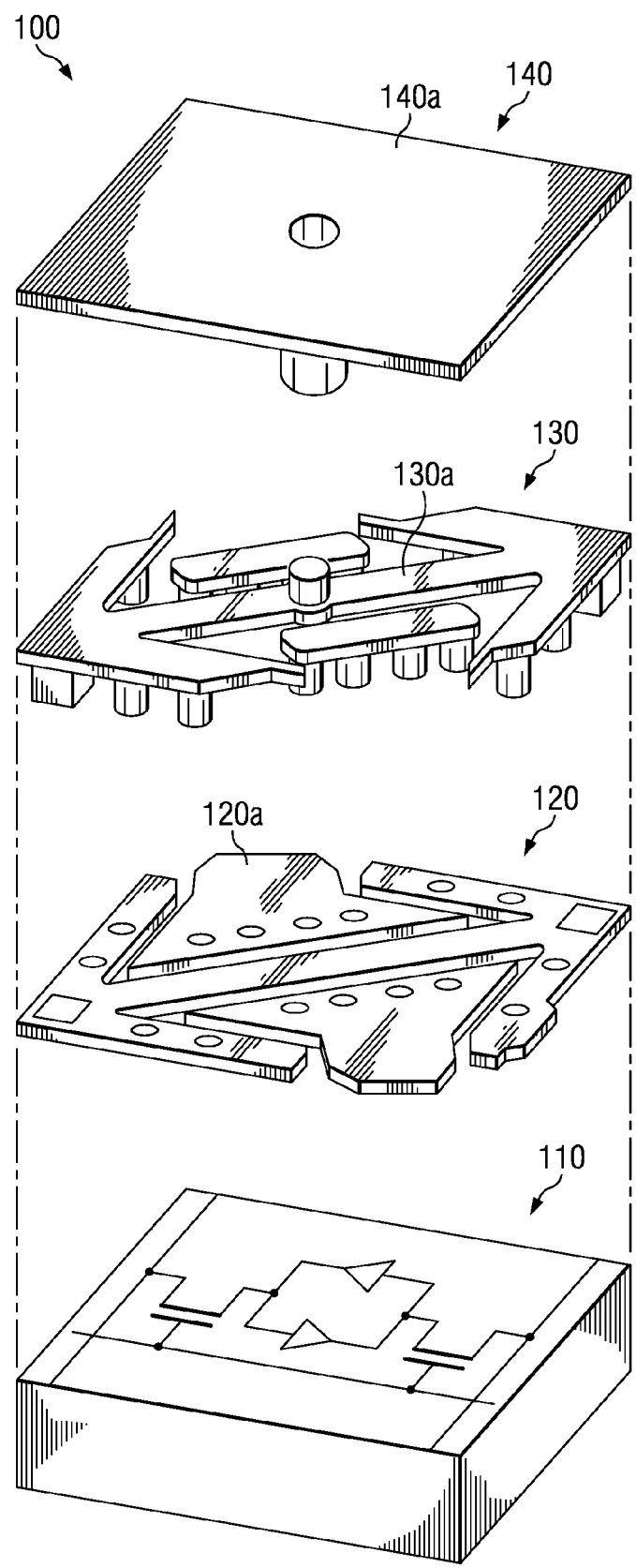
FIG. 1 is an exploded view of a DMD pixel structure.

FIG. 1 is an exploded view of a DMD pixel element 100. Pixel element 100 is one of an array of such elements fabricated on a wafer, using semiconductor fabrication techniques.

DMD pixel element 100 is a monolithically integrated MEMS superstructure cell generally fabricated over a CMOS SRAM cell 110. The CMOS SRAM cell may in one embodiment be configured with, for example, six transistors. Another embodiment may be configured with, for example, five transistors. Other memory structures may alternatively be used such as, for example, a DRAM, MRAM, or flash memory cell. Two sacrificial layers have been removed by plasma etching to produce air gaps between three metal layers of the superstructure. For purposes of this description, the three metal layers are "spaced" apart by being separated by these air gaps.

The uppermost metal layer 140 has a reflective mirror 140a. The air gap under the mirror 140a frees the mirror 140a to rotate about a compliant torsion hinge 130a, which is part of the second metal layer 130. A third metal (M3) layer 120 has address electrodes 120a for the mirror 140a, the address electrodes being connected to SRAM cell 110. The M3 layer 120 further has a bias bus, which generally interconnects the mirrors of all pixels to a bond pad at the chip perimeter.

The DMD mirrors 140a may each be 160 μm square and are typically made of aluminum for high reflectivity; however, other high reflectivity materials may be used. They may be arrayed on 170 μm centers to form a matrix having a high fill factor (~90%). The high fill factor generally provides high efficiency for light use at the pixel level and a seamless (pixilation-free) projected image. The hinge layer 130 under the mirror 140a permits a close spacing of the mirror 140, and because of the underlying placement of the hinges, an array of pixel elements 100 is referred to as a "hidden hinge" type DMD architecture.

In operation, electrostatic fields are developed between the mirror 140a and its address electrodes 120a, creating an electrostatic torque. This torque works against the restoring torque of the hinge 130a to produce mirror rotation in a positive or negative direction. The mirror 140a may rotate until it comes to rest (or lands) against spring tips, which are part of the hinge layer 130. The spring tips may be attached to the addressing layer 120, and thus provide a stationary but flexible landing surface for the mirror 140a.

FIG. 2 is a block diagram depicting some of the main components of a DMD device. DMD chip 200 has micromirror memory array 202, column data driver 204, reset driver 206, row select block 208, and bidirectional sense amplifier (BSA) 210. Components column data driver 204, row select block 208, BSA 210, and memory array 202 may function essentially as in the prior art, but with shifted voltages, as will be further explained in detail with respect to FIG. 5. Furthermore, micromirror memory array 202 may be isolated with respect to the substrate.

Reset driver 206 has high voltage modifications and may be formed using standard CMOS processes in a grounded substrate. Reset driver 206 is a high voltage portion of DMD chip 200.

DMD chip 200 also has BSA level shift 212, row select level shift 214, and column data level shift 216 circuitry, as described in detail below.

With reference now to FIG. 3, a schematic of a portion of a digital micromirror device includes an SRAM latch, mirror layers, row select, and column data circuitry. Digital micromirror device SRAM latch 300 schematically shows mirror layers 302 and underlying CMOS layers 304. Upon application of an electric field E, mirror layer 306 tilts to electrode 308, thus activating a digital micromirror device pixel. A reset voltage applied to mirror layer 306 deactivates the DMD pixel. Traditionally, the reset voltage may be, for example, about −10 volts. The voltages applied to the inputs of SRAM latch inverters 310 and 312 are $V_{SS}$ (voltage to the source of a CMOS transistor) and $V_{DD}$ (voltage to the drain of a CMOS transistor). Generally, $V_{SS}$ denotes a negative power supply or ground, and $V_{DD}$ denotes a positive power supply. $V_{SS}$ voltage 314 and $V_{DD}$ voltage 316 are traditionally about 0 volts and 8.5 volts respectively.

Row select 318 and column data 320 circuitry are shown. Write transistor 322 is enabled to allow new data to be written to DMD SRAM latch 300. A first pair of transistors 310 forms a first inverter. A second pair of transistors 312 forms a second inverter. The output of the first inverter is connected to the input of the second inverter, and the output of the second inverter is connected to the input of the first inverter. When fabricated as part of a micromirror cell, the two inverter output nodes 324 and 326 are connected to the address electrodes to allow the data stored in the SRAM cell to control the deflection of the micromirror.

When a logic high signal is present on the input bitline and the write transistor 322 is enabled, the logic high signal reaches signal node 324. The logic high at node 324 drives node 326 low. The second inverter drives a logic high on node 324, ensuring the data written to the cell will remain after the write transistor 322 is disabled.

Figure 4:
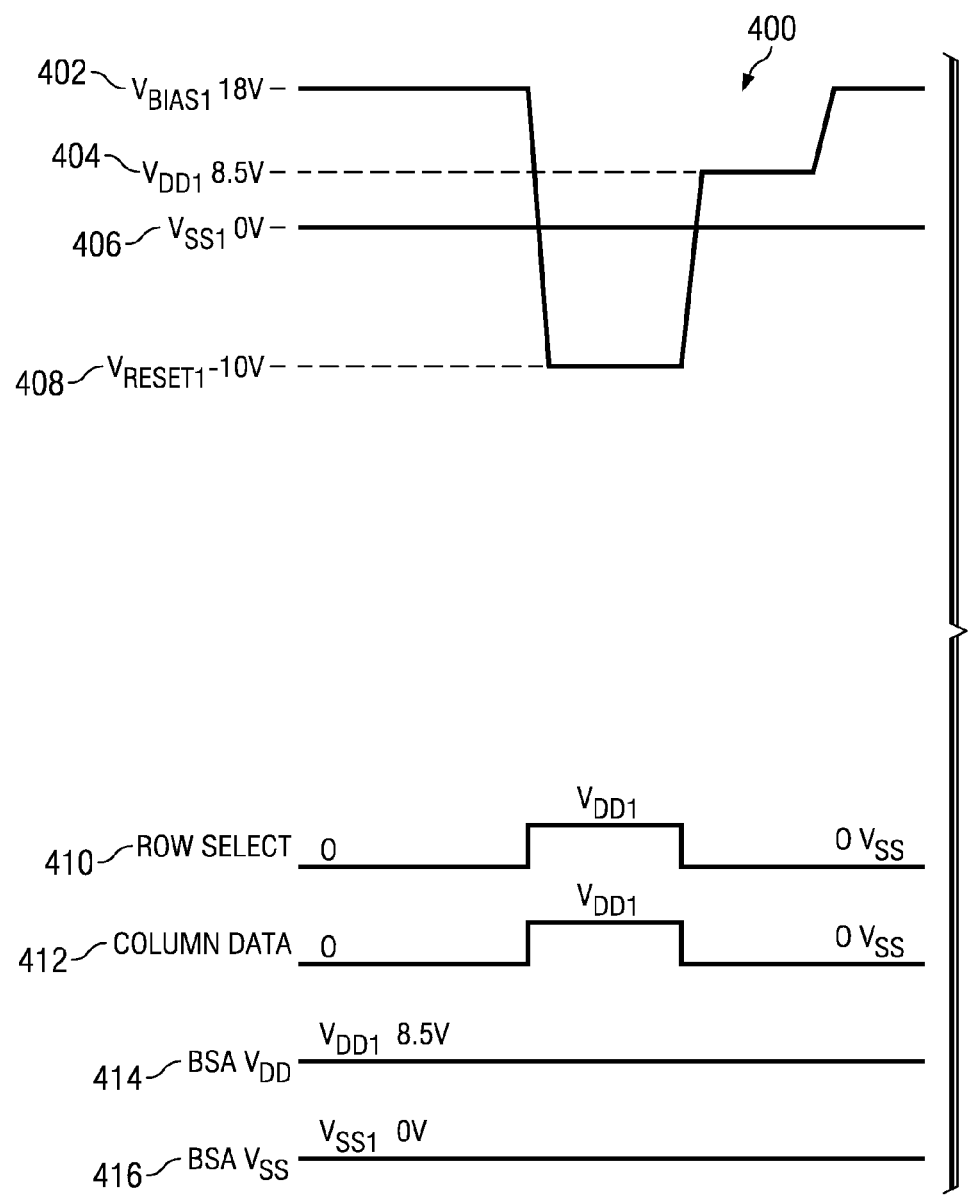
FIG. 4 shows prior art voltage traces of the various signals for a DMD device.

FIG. 4 illustrates prior art plots of the voltage traces of the various signals for an array of DMD pixels shown in the prior art. Voltage trace 400 shows the voltage levels of a bipolar reset trace for a prior art DMD device. $V_{bias1}$ 402 denotes a steady state power supply voltage, typically about 18V. $V_{offset1}$ or $V_{DD1}$ 404 denotes the voltage used to tilt a metal layer, such as metal layer 306 in FIG. 3, to turn the mirror on. Typically, $V_{DD1}$ 404 is 8.5V. $V_{SS1}$ 406 is a neutral voltage that does not tilt the metal layer, typically about 0V. In addition, $V_{reset1}$ 408 denotes the voltage that may be used to reset a tilted metal layer to a non-tilted position, typically about −10V. Note that bipolar reset voltage trace 400 shows voltage swings in excess of the voltages used for operation of the CMOS SRAM latch pictured in FIG. 3.

In addition, row select trace 410, column data trace 412, BSA power for the memory array $V_{DD1}$ 414 and $V_{SS1}$ 416 are shown. The row select trace 410 and the column data trace 412 show a high signal of $V_{DD1}$ and a low signal of $V_{SS1}$. Further, $V_{DD1}$ 414 and $V_{SS1}$ 416 are shown; $V_{DD1}$ may be 8.5V, and $V_{SS1}$ may be 0V, as in this example.

Figure 5:
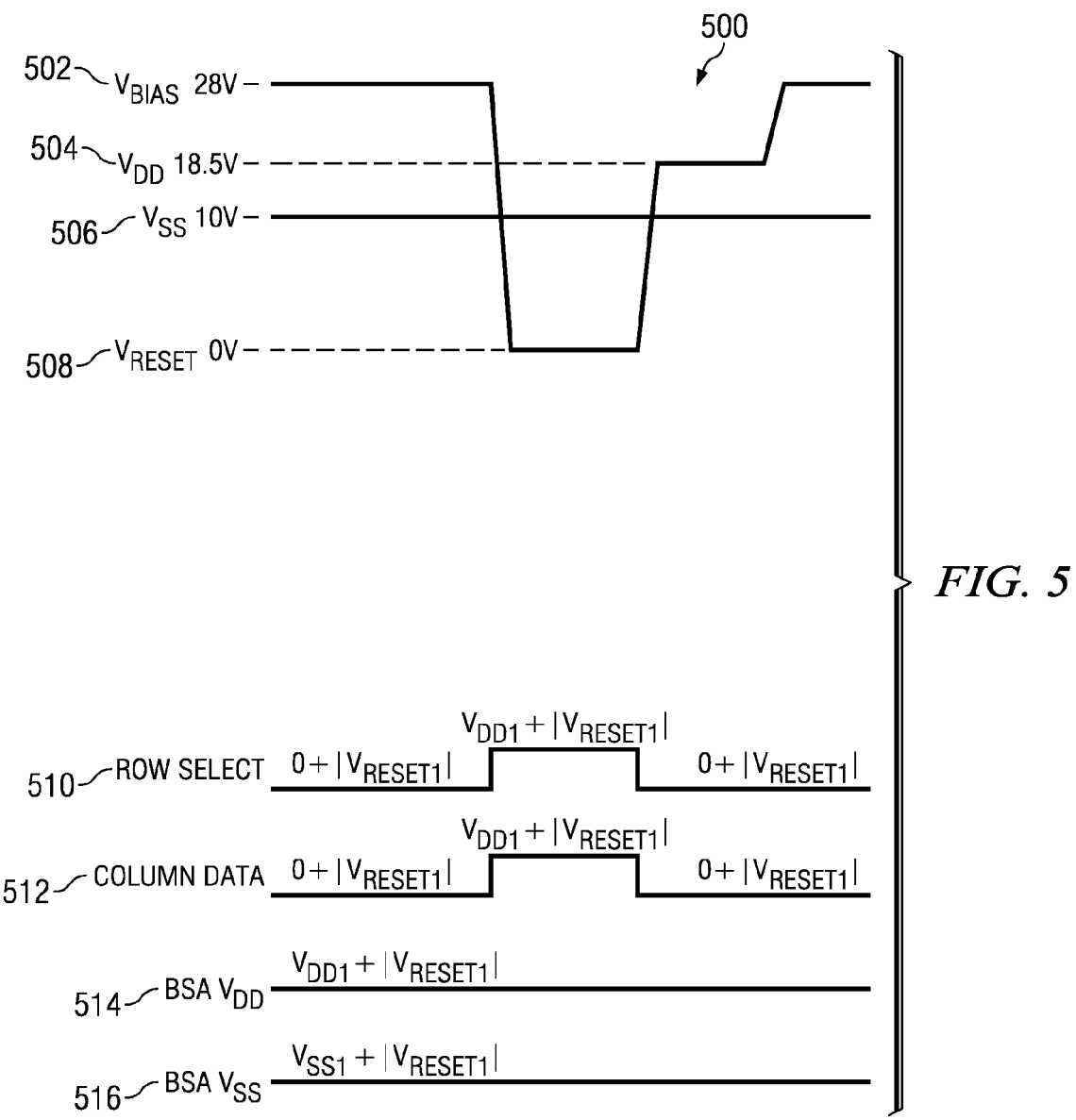
FIG. 5 shows voltage traces of the various signals for a DMD device.

Turning now to FIG. 5, voltage traces 500 show elevated voltages of the voltage traces in accordance with an illustrative embodiment. The voltages are shifted as follows:

(502) $V_{bias} = V_{bias1} + |V_{reset1}|$ (504) $V_{DD} = V_{DD1} + |V_{reset1}|$ (506) $V_{SS} = V_{SS1} + |V_{reset1}|$ (508) $V_{reset} = V_{reset1} + |V_{reset1}|$ wherein $V_{bias1}$ is the pre-shifted voltage of $V_{bias}$, and $V_{reset1}$ is the pre-shifted voltage of $V_{reset}$. Therefore, as an example, if $V_{bias1}$ is 18V and $V_{reset1}$ is −10V, then $V_{bias}$ is 18V plus the absolute value of $V_{reset}$, or 10V. Therefore, in this example, $V_{bias}$ 502 is 28V. Similarly, if $V_{DD1}$ is 8.5V, $V_{SS1}$ is 0V, and $V_{reset1}$ is −10V, then in applying the equations above: $V_{DD}$ 504 is 18.5V, $V_{SS}$ 506 is 10V and $V_{reset}$ 508 is 0V.

Voltage trace 500 generally has the same form as voltage trace 400 in FIG. 4 with an across-the-board voltage shift of the absolute value of $V_{reset1}$. In addition, row select trace 510, column data trace 512, BSA power $V_{DD}$ 514 and $V_{SS}$ 516 are shown with the shifted voltages. Row select trace 510 and column data trace 512 have a high signal level of $V_{DD1}$ plus the absolute value of $V_{reset1}$, and they have a low signal level of $V_{SS1}$ plus the absolute value of $V_{reset1}$. Further, $V_{DD}$ 514 has a value of $V_{DD1}$ plus the absolute value of $V_{reset1}$, and $V_{SS}$ 516 has a value of $V_{SS1}$ plus the absolute value of $V_{reset1}$. In this example, the values are 18.5V and 10V, respectively. The shifted voltages generally eliminate the large negative rest voltage of the prior art, thus avoiding the forward biasing of PN junctions in the memory circuitry.

These voltages may be shifted using a charge pump, a boost converter, or other type of DC to DC converter. A charge pump is a circuit that uses capacitors as energy storage elements to create a higher voltage power source. A boost converter (step-up converter) is a power converter with an output dc voltage greater than its input dc voltage. It is in a class of switching-mode power supplies (SMPS) containing at least two semiconductor switches (a diode and a transistor) and at least one energy storage element. Filters made of inductor and capacitor combinations are often added to a converter's output to improve performance. DC to DC converters may be of several types, including the boost converter. Charge pumps, boost converters, and DC to DC converters are well known to those of ordinary skill in the art.

Figure 6:
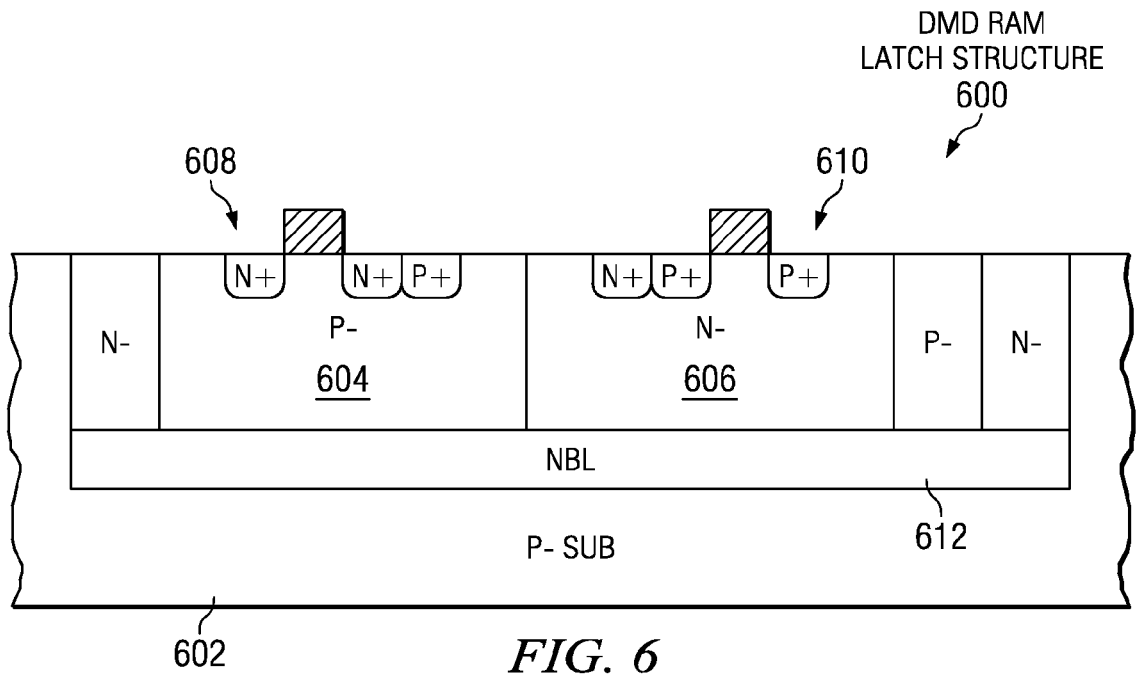
FIG. 6 is a cross-sectional view of the isolation of a memory array from the P-substrate.

FIG. 6 is a cross-sectional view of a DMD structure for isolation of a memory cell from the P-substrate in accordance with an illustrative embodiment. The array of memory cells are formed in a grounded substrate. The high voltage reset circuitry may be implemented using CMOS processes and at least one symmetrical or asymmetrical extended drain MOSFET. The DMD memory array is isolated from the substrate, and the set of operational voltages of the DMD memory array are shifted by the standard operational voltage plus the absolute value of the reset voltage, thereby allowing a high voltage reset without damaging the DMD memory array.

The DMD memory array may be a CMOS SRAM array. The isolation of the DMD memory array may be accomplished by incorporating a standard CMOS process with a buried layer. The buried layer may be either N or P type. An N type buried layer (NBL), is used to effectively isolate the memory P-well from a P type substrate. Alternatively, a P type buried layer may be used to isolate the memory N-well from an N type substrate. Additionally, this system and method allow for a shifted voltage block stepped address operation in the DMD micromirror array. In other words, the column data and row select voltages are shifted by the absolute value of the reset voltage.

Structure 600 is an SRAM latch, and may be used for the SRAM latch of FIG. 2. P-substrate 602 has P-well 604 and N-well 606 formed within. NMOS transistor 608, an N channel MOSFET, is formed within P-well 604; and PMOS transistor 610, a P channel MOSFET, is formed within N-well 606. NBL 612, an N type buried layer, is formed between the WELL structures 604 and 606 and the P-substrate 602. NBL 612 provides isolation between P-well 604 and P-substrate 602. In accordance with an illustrative embodiment, the P-substrate may be set to $V_{reset1} + |V_{reset1}|$, which is effectively 0V. The MOSFETS 608 and 610 may operate using voltages $V_{SS1} + |V_{reset1}|$, and $V_{DD1} + |V_{reset1}|$, which in this example are 10V and 18.5V respectively.

An advantage of an embodiment of the present invention is that operating structure 600 at these voltages provides for more robust breakdown voltages, thus the structure is more resistant to failure. This configuration makes the NBL a positive voltage with respect to the P-substrate. Therefore, illustrative embodiments may provide higher breakdown voltages between P-substrate 602 and N buried layer 612. It is within the scope of the illustrative embodiments that the DMD device substrate may be of an N type material and that the buried layer isolating the memory array from the substrate may be of a P type material, with all of the voltage shifts discussed above appropriate for the opposite polarity material. In addition, the actual values of the voltages may vary in different embodiments, both as a group and relative to one another.

Figure 7:
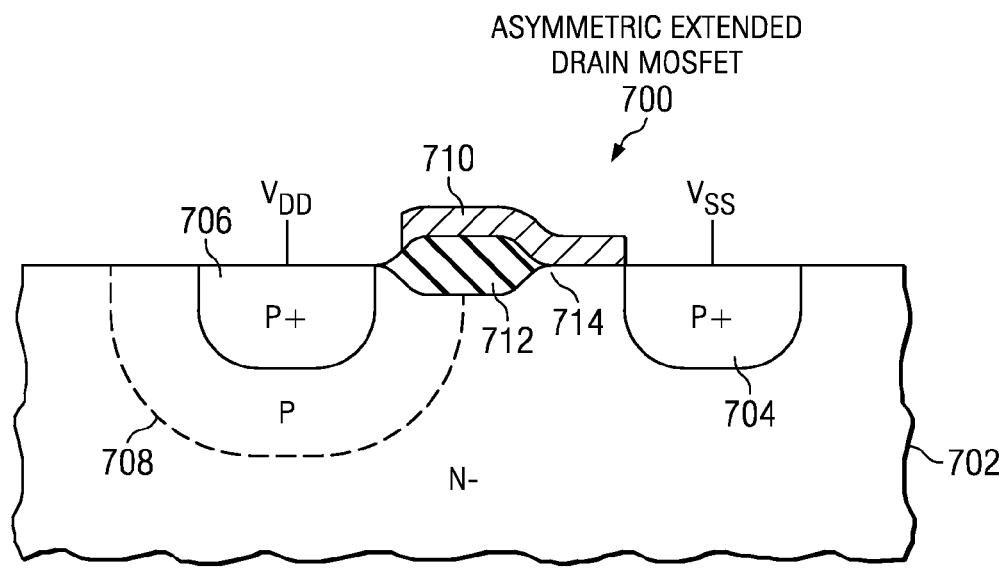
FIG. 7 is a cross-sectional view of an asymmetrical extended drain transistor for a reset driver in a digital micromirror device.

FIG. 7 is a cross sectional view of an asymmetrical extended drain transistor for a digital micromirror device. It is within the scope of the illustrative embodiments that the high voltage modifications of the reset driver may comprise extended drain transistors, asymmetrical or symmetrical, and of either N or P type. One advantage of this embodiment is the higher breakdown voltages of the extended drain MOSFET as compared to a standard MOSFET configuration. PMOS transistor 700 is a PMOS device; however, an alternative embodiment may be an NMOS device. PMOS transistor 700 shows a MOSFET structure within N-well 702. Source region 704 of PMOS 700 may be formed as a standard PMOS source region. Drain region 706 has a P doped region, P tank 708, beneath the more highly doped P+ drain region 706. Additionally, gate electrode 710 extends onto gate oxide 714 and field oxide 712. An advantage of this embodiment is the implementation of higher voltage CMOS devices using standard CMOS processes, such as the DMD SRAM latch device with a shifted voltage.

Although the present invention and its advantages have been described in detail, it should be understood that various changes, substitutions, and alterations can be made herein without departing from the spirit and scope of the invention as defined by the appended claims. For example, it will be readily understood by those skilled in the art that the voltages and polarities may be altered while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a grounded substrate;
a reset driver configured to drive a reset voltage, wherein the reset driver has at least one extended drain transistor in the grounded substrate;
a buried layer disposed in the grounded substrate;
a memory array disposed in the substrate, wherein the memory array is isolated from the grounded substrate by the buried layer; and
level shifting circuitry configured to shift a set of voltages of the memory array with respect to the reset voltage.

2. The semiconductor device of claim 1, wherein the memory array is a complementary metal-oxide semiconductor (CMOS) memory array.

3. The semiconductor device of claim 2, wherein the memory array is a static random access memory (SRAM) array.

4. The semiconductor device of claim 1, wherein the set of voltages of the memory array includes a row select voltage, a column data voltage and bidirectional sense amplifier (BSA) power voltages, and wherein an amount by which the set of voltages is shifted is selected from the group consisting of 10 volts, the absolute value of the reset voltage, and a fixed quantity with reference to the reset voltage.

5. The semiconductor device of claim 1, wherein the substrate is a P type substrate and the buried layer is an N type buried layer.

6. The semiconductor device of claim 1, wherein the substrate is an N type substrate and the buried layer is a P type buried layer.

7. The semiconductor device of claim 1, wherein the reset driver is a CMOS structure.

8. The semiconductor device of claim 1, wherein the reset driver comprises a transistor selected from the group consisting of an asymmetrical extended drain transistor and a symmetrical extended drain transistor.

* * * * *